United States Patent [19]
Tomisawa et al.

[11] Patent Number: 5,783,359
[45] Date of Patent: Jul. 21, 1998

[54] RUBBER PHOTORESIST COMPOSITE AND A METHOD FOR PRODUCING A CIRCUIT BOARD USING THEREOF

[75] Inventors: Shigeru Tomisawa; Yasuhiro Yoneda; Masahiko Sugimura, all of Kawasaki, Japan

[73] Assignees: Fujitsu Limited, Kanagawa; Nippon Zeon Co., Ltd., Tokyo, both of Japan

[21] Appl. No.: 848,521

[22] Filed: Apr. 28, 1997

Related U.S. Application Data

[63] Continuation of Ser. No. 489,931, Jun. 13, 1995, abandoned.

[30] Foreign Application Priority Data

Jun. 13, 1994 [JP] Japan ..................... 6-130617

[51] Int. Cl.$^6$ ............... G03C 1/695; G03F 7/004; G03F 7/012
[52] U.S. Cl. ............ 430/270.1; 430/311; 430/314; 430/318
[58] Field of Search ................ 430/270.1, 311, 430/314, 318

[56] References Cited

U.S. PATENT DOCUMENTS

| | | | |
|---|---|---|---|
| 3,887,373 | 6/1975 | Hays et al. | 430/325 |
| 4,525,523 | 6/1985 | Nakamura et al. | 524/572 |
| 5,250,392 | 10/1993 | Marcotte, Jr. et al. | 430/292 |

FOREIGN PATENT DOCUMENTS

| | | | |
|---|---|---|---|
| 1342884 | 1/1974 | United Kingdom | G03C 1/60 |

*Primary Examiner*—Mark F. Huff
*Attorney, Agent, or Firm*—Armstrong, Westerman, Hattori, McLeland & Naughton

[57] ABSTRACT

This invention relates to a rubber photoresist composite which can be applied evenly on a large-sized or square-shaped baseboard and a method for producing a circuit board using thereof. A rubber photoresist composite of this invention comprises a photosensitive agent, a cyclized rubber and a solvent, said solvent including a solvent component having a boiling point ranging from 150° C. to 220° C. The rubber photoresist composite can be applied evenly on the baseboard rotated at a high speed by a spinner.

1 Claim, 1 Drawing Sheet

RUBBER PHOTORESIST COMPOSITE AND A METHOD FOR PRODUCING A CIRCUIT BOARD USING THEREOF

This application is Continuation of application Ser. No. 08/489,931 filed Jun. 13, 1995, now abandoned.

BACKGROUND OF THE INVENTION

1. Field of the Invention

The present invention generally relates to a rubber photoresist composite and a method for producing a circuit board using thereof, and more particularly to a rubber photoresist composite which can be applied evenly on a baseboard and a method for producing a circuit board using thereof.

2. Description of the Prior Art

In a process for producing a thin-layer circuit board, a photoetching process is an indispensable technique. Also, in a process of producing an IC (Integrated Circuit), the photoetching process is important as is a diffusion technique.

One of the most useful photoresist composites used in the above fields is a cyclized rubber photoresist composite. The rubber photoresist composite is prepared by dissolving cyclized rubber in an organic solvent, adding a diazido photosensitive agent to the solution, filtering the solution and removing impurities from the solution.

The rubber photoresist composite including the cyclized rubber has great acid-resistance and base-resistance characteristics and anti-corrosion characteristics with respect to an etching liquid. Thus, this type of photoresist is used when a fine pattern for an IC is required.

Hereinafter, a conventional method for producing a circuit board using the rubber photoresist composite is described.

At first, the rubber photoresist composite is applied on a copper layer formed on a baseboard rotated at a high speed in order to form a thin layer of the rubber photoresist composite. After the thin layer of the rubber photoresist composite is prebaked, a photomask is placed above the thin layer and the thin layer is exposed by ultraviolet rays. By this step, a pattern of the photomask is transferred to the thin layer. Subsequently, an unexposed portion of the thin layer is removed. After that, the exposed copper layer is removed by an etching process using an etching liquid which dissolves copper. After the etching process, the thin layer of the rubber photoresist composite is removed. Thus, the circuit board having a circuit pattern of the copper layer is formed.

In the conventional rubber photoresist composite including cyclized rubber (i.e. cyclized polyisoprene rubber), xylene is the only solvent being used. However, since xylene has a relatively low boiling point as a solvent, when the rubber photoresist composite is applied on the circuit board rotated at a high speed, the thickness of the thin layer at a periphery of the baseboard is much thicker than that at a center of the baseboard, and fine etching of an image cannot be realized.

SUMMARY OF THE INVENTION

Accordingly, it is a general object of the present invention to provide a novel and useful rubber photoresist compound which can be applied evenly on a large-sized circuit board, that is, a thickness of the rubber photoresist composite applied at the periphery of the baseboard can be almost equal to that applied at the center thereof.

As a result of research to remove the above disadvantages, the inventors of the present invention found that by including a solvent component having a boiling point ranging from 150° C. to 220° C. in a solvent, a uniformity in thickness of the rubber photoresist composite is much improved.

That is, the above object of the present invention is achieved by a rubber photoresist composite comprising a photosensitive agent, a cyclized rubber and a solvent, the solvent including a solvent component having a boiling point ranging from 150° C. to 220° C.

In the above invention, a content of the solvent component having a boiling point ranging from 150° C. to 220° C. in the solvent can be 5–70% by weight. As the solvent, a mixture of xylene and the solvent component having a boiling point ranging from 150° C. and 220° C. can be used. As the solvent component having a boiling point ranging from 150° C. to 220° C., DECALIN (decahydronapthalene) can be used.

According to the rubber photoresist composite of the present invention, the solvent includes the solvent composition having a boiling point ranging from 150° C. to 220° C. Therefore, when the rubber photoresist composite is applied on a large-sized baseboard or a square-shaped circuit board by, for example, a spin-coating method, the solvent does not evaporate until the rubber photoresist composite is evenly spread and a thickness of the rubber photoresist compound at a periphery of the baseboard is almost equal to that at a center thereof.

There are two types of photoresist composites, a negative-type photoresist composite and a positive-type photoresist composite. In the negative-type photoresist composite, an exposed portion is polymerized and becomes insoluble and an unexposed portion can be dissolved in a developing liquid and be removed. In a positive-type photoresist composite, an exposed portion thereof is decomposed and can be dissolved in a developing liquid and an unexposed portion can remain. The negative-type photoresist composite is generally suitable for producing a fine pattern of the thin-layer circuit board. However, the rubber photoresist composite of the present invention can be formed into both types.

As a photosensitive agent, various types of photosensitive agents, such as p-phenylene-bisazido, p-diazidobenzophenone, 4,4'-diazidobenzophenone, 4,4'-diazidophenylmethane, 4,4'-diazidostilbene, 4,4'-diazidochalcone, 2,6-di-(4'-azidobenzal)cyclohexanone or 2,6-di-(4'-azidobenzal)-4-methylcyclohexanone, can be used. However, the photosensitive agent used in the present invention is not limited to those listed above.

As for the cyclized rubber, various types have already been proposed so far. However, the cyclized rubber used in the present invention is not limited to a specific one. Also, the cyclized rubber used in the present invention can be obtained in various ways. For example, organic sulfonic acid such as p-toluene sulfonic acid or chlorosulfonic acid can be directly reacted with raw rubber or rubber solution so that a part of the chain molecule in the rubber is cyclized and a number of double bonds contained in the molecule is reduced. In this case, natural rubber or synthetic rubber can be used as rubber material. As the synthetic rubber, various types can be used although polyisoprene rubber is preferred.

As a solvent for the rubber photoresist composite including cyclized rubber, xylene is usually used. The boiling point of xylene is lower than 150° C.

As a solvent component included in the solvent, various organic solvents, such as DECALIN (decahydronaphthalene), n-decane, diethylbenzene, isopropylbenzene, 1,2,3-trimethylbenzene, 1,2,4- trimethylbenzene, 1,2,5-trimethylbenzene, 2-ethyl-1-methylbenzene, 3-ethyl-1-methylbenzene, 1-ethyl-1-methylbenzene, n-butylbenzene, isobutylbenzene, p-cymene, 1,2,4,5-tetramethylbenzene and tetralin, can be listed.

The solvent component mixed with the solvent is limited to ones having a boiling point ranging from 150° C. to 220° C. The reason for setting the lower limit to 150° C. is that when the boiling point is lower than 150° C., the difference in boiling points between the solvent and the solvent component is small, and the uniformity of the thickness of the rubber photoresist composite cannot be realized. The reason for setting the upper limit to 220° C. is that when the boiling point is higher than 220° C., the solvent component remains in the thin layer of the rubber photoresist composite even after the thin layer of the rubber photoresist composite is prebaked.

As for the content of the solvent component having a boiling point ranging from 150° C. to 220° C., when it is less than 5%, it is not sufficient enough to obtain a uniformity of the thickness of the thin layer. On the contrary, when it exceeds 70%, much solvent component may possibly remain in the rubber photoresist composite due to a low volatility of solvent component when the thin layer is prebaked. Therefore, a mixing ratio is preferably 5–70% although 10–50% is more preferable. However, a solvent component composed of only DECALIN (decahydronaphthalene) can be used. When the xylene is used as a solvent, DECALIN (decahydronaphthalene), which has a low volatility and a high solubility with xylene, is the most preferred as a solvent component.

The solvent component having a boiling point ranging from 150° C. to 220° C. contained in the solvent, is not limited to a single compound, but a mixture of several compounds (i.e., a DECALIN (decahydronaphthalene)/n-decane mixture: mixing ratio 1/1) can be used.

The rubber photoresist composite of the present invention can include other components, such as a stabilizer.

The above object of the present invention is also achieved by a method for producing a circuit board, comprising the steps of forming a metal layer on a baseboard, applying a rubber photoresist composite on the metal layer to form a thin layer of the rubber photoresist composite, the rubber photoresist composite comprising a photosensitive agent, a cyclized rubber and a solvent, the solvent including a solvent component having a boiling point ranging from 150° C. to 220° C., covering the thin layer of the rubber photoresist composite by a photomask having a prescribed pattern, exposing the thin layer of the rubber photoresist composite by ultraviolet rays through the photomask so that the prescribed pattern of the photomask is transferred to the thin layer of the rubber photoresist composite, removing an unexposed portion of the thin layer of the rubber photoresist composite, etching an exposed portion of the metal layer, and removing the thin layer of the rubber photoresist composite. In the above invention, a copper layer can be used as a metal layer.

According to the above invention, since the rubber photoresist composite can be evenly applied on the metal layer, the metal layer of a fine pattern can be realized and a circuit board of a high quality can be produced.

Other objects and further features of the present invention will be apparent from the following detailed description when read in conjunction with the accompanying drawings.

DESCRIPTION OF THE PREFERRED EXAMPLE

Figure 1A:
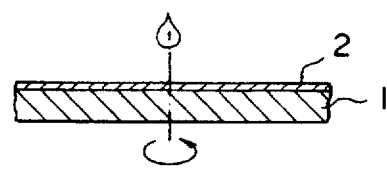
FIGS. 1A–1F are schematic illustrations showing a method for producing a circuit board of the present invention.

The preferred example of the present invention will now be described in detail.

EXAMPLE

A rubber photoresist composite (Nihon Zeon Inc., ZPN310), in which xylene is the only solvent, was mixed with DECALIN (decahydronaphthalene) as a solvent component having a boiling point ranging from 150° C. to 210° C. in order to prepare a rubber photoresist composite. The preparation process was conducted using ordinary techniques. The prepared rubber photoresist composite was transparent, yellow and did not include suspended solids, precipitates, dusts or gel substances. A composition of the rubber photoresist composite was as follows.

| | |
|---|---|
| Solvent composition (Decalin (decahydrenaphthalene) content in the solvent) | About 30% by weight |
| Viscosity | About 400cp (25° C.) |
| Concentration of solid content | About 20% by weight |
| Cyclization ratio | About 80% |
| Photosensitive agent | 1.0 phr |
| Stabilizer | 1.7 phr |
| Water content | Under 200 ppm |
| Each metal impurity | Under 0.5 ppm |

The rubber photoresist composite was dropped on a 9-inch square-shaped circuit board rotated at a high speed by a spinner in order to form a thin layer of the rubber photoresist composite. After the thin layer was formed, the circuit board was prebaked at 80° C. for 20 minutes to remove the solvent component and to improve an adhesion between the circuit board and the rubber photoresist composite.

After the circuit board was prebaked, the thickness of the rubber photoresist composite was measured both at a periphery and at a center of the circuit board. Results were as follows:

| | |
|---|---|
| Center of circuit board | 10 μm |
| Periphery of circuit board | 10 μm |

As is apparent from the results, when the rubber photoresist compound having the above-described composition was applied on the square-shaped circuit board by a spin-coat method, the thickness of the rubber photoresist compound at the periphery was almost equal to that at the center. That is, the uniformity in thickness of the rubber photoresist composite was realized.

The reason for the results is that the solvent for the rubber photoresist composite includes DECALIN (decahydronaphthalene) whose boiling point is between 150° C. and 220° C. When the solvent does not include the solvent component having a boiling point ranging from 150° C. to 220° C., the uniformity in thickness of the rubber photoresist composite cannot be realized. In order to prove it, a comparative example will be described hereinafter.

Comparative Example

A rubber photoresist composite (Nihon Zeon Inc., ZPN310), in which xylene is the only solvent, was further mixed with xylene in order to prepare a rubber photoresist composite. The preparation process was conducted using ordinary techniques. The prepared rubber photoresist composite was transparent, yellow and did not include suspended solids, precipitates, dusts or gel substances. A composition of the rubber photoresist composite was as follows.

| | |
|---|---|
| Solvent composition (Content of the solvent component having a boiling point ranging from 150° C. to 220° C.) | 0% |
| Viscosity | About 400 cp (25° C.) |
| Concentration of solid content | About 20% |
| Cyclization ratio | About 80% |
| Photosensitive agent | 1.0 phr |
| Stabilizer | 1.7 phr |
| Water content | Under 200 ppm |
| Each metal impurity | Under 0.5 ppm |

The rubber photoresist composite was dropped on a 9-inch square-shaped circuit board rotated at a high speed by a spinner in order to form a thin layer of the rubber photoresist composite. After the thin layer was formed, the circuit board was prebaked at 80° C. for 20 minutes to remove the solvent component and to improve adhesion between the circuit board and the rubber photoresist composite.

After the circuit board was prebaked, the thickness of the rubber photoresist composite layer was measured both at a periphery and a center of the circuit board. Results were as follows.

| | |
|---|---|
| Center of circuit board | 10 μm |
| Periphery of circuit board | 14 μm |

As is apparent from the results, when the conventional rubber photoresist compound which does not include the solvent component having a boiling point ranging from 150° C. to 220° C. was applied on the square-shaped circuit board by a spin coat method, the thickness at the periphery was larger than that at the center and thus the uniformity in thickness of the rubber photoresist composite was not realized.

In the above example, the rubber photoresist composite was applied on the circuit board of the 9-inch size. However, when the rubber photoresist composite was applied on circuit boards of different sizes, similar results were obtained.

Also, in the above example, DECALIN (decahydronaphthalene) was used as the solvent having a boiling point ranging from 150° C. to 220° C. However, when other solvents having a boiling point within that range were used, similar results were obtained.

Next, a method for producing a circuit board using the rubber photoresist composite described above will be described. FIGS. 1A–1F are schematic illustrations showing a process for producing the circuit board.

Figure 1B:
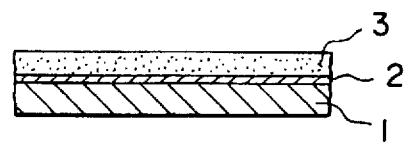

In FIG. 1A, a copper layer 2 is formed on a circuit board 1 by, for example, a sputtering method. The rubber photoresist composite of the present invention is applied on the copper layer 2 of the circuit board 1 rotated at a high speed by a spinner, as shown in FIG. 1A. By this step, a thin layer 3 of the rubber photoresist composite is formed on the copper layer 2, as shown in FIG. 1B. The rubber photoresist composite of the present invention includes the solvent composition having a boiling point ranging from 150° C. to 220° C. Therefore, the rubber photoresist composite can be evenly spread on the circuit board 1.

Figure 1C:
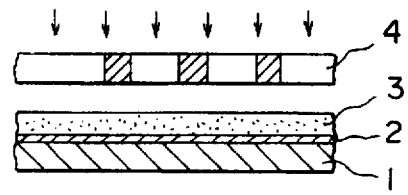

After the thin layer 3 is formed, the circuit board 1 is prebaked to remove the solvent component and to improve an adhesion between the copper layer 2 and the thin layer 3. After that, a photomask 4 is placed above the thin layer 3 and the thin layer 3 is exposed by ultraviolet rays, as shown in FIG. 1C. By this step, a pattern of the photomask 4 is transferred to the thin layer 3 of the rubber photoresist composite.

Figure 1D:
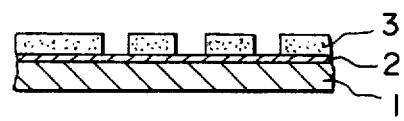
Figure 1E:
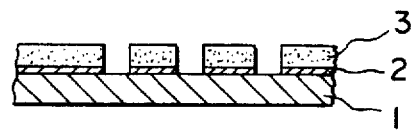
Figure 1F:
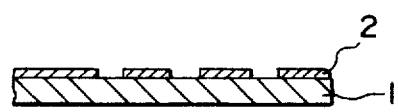

Subsequently, an unexposed portion of the thin layer 3 of the rubber photoresist compound is dissolved and removed by a developing liquid, as shown in FIG. 1D. After that, the exposed copper layer 2 is removed by an etching process using an etching liquid which dissolves copper, as shown in FIG. 1E. After the etching process, the thin layer 3 of the rubber photoresist composite is removed, as shown in FIG. 1F. Thus, the circuit board having a circuit pattern of copper layer 2 is formed.

According to the method described above, since the rubber photoresist composite can be evenly applied on the copper layer, the copper layer of a fine pattern can be realized and a circuit board of a high quality can be produced.

Further, the present invention is not limited to the above example, but various variations and modifications may be made without departing from the scope of the present invention.

What is claimed is:

1. A rubber photoresist composite comprising: a photosensitive agent, a cyclized rubber and a solvent, wherein said solvent is a mixture of xylene and decahydronaphthalene, and a content of said decahydronaphthalene in said solvent is 10–50% by weight.

* * * * *